US008669700B2

(12) United States Patent
Choi et al.

(10) Patent No.: US 8,669,700 B2
(45) Date of Patent: Mar. 11, 2014

(54) ORGANIC LIGHT EMITTING DIODE DISPLAY INCLUDING SOURCE AND DRAIN ELECTRODES SEPARATED FROM A GATE ELECTRODE

(75) Inventors: Jong-Hyun Choi, Yongin (KR); Jae-Kyeong Jeong, Yongin (KR); Hui-Won Yang, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 697 days.

(21) Appl. No.: 12/923,136

(22) Filed: Sep. 3, 2010

(65) Prior Publication Data
US 2011/0057181 A1    Mar. 10, 2011

(30) Foreign Application Priority Data
Sep. 4, 2009    (KR) .................. 10-2009-0083666

(51) Int. Cl.
*H01L 51/50* (2006.01)
*H01L 51/52* (2006.01)
*H01L 29/41* (2006.01)
*H01L 29/786* (2006.01)

(52) U.S. Cl.
USPC ............. 313/506; 313/504; 313/505; 257/43; 257/59

(58) Field of Classification Search
USPC ...................... 313/504, 506; 257/43
See application file for complete search history.

(56) References Cited

U.S. PATENT DOCUMENTS

| 6,287,898 B1 * | 9/2001 | Sera ............................... 438/149 |
| 7,833,846 B1 * | 11/2010 | Choi et al. .................... 438/149 |
| 2002/0056838 A1 * | 5/2002 | Ogawa ............................. 257/59 |
| 2008/0074359 A1 * | 3/2008 | Chung ............................. 345/76 |
| 2009/0194766 A1 * | 8/2009 | Park et al. ....................... 257/43 |
| 2009/0321731 A1 * | 12/2009 | Jeong et al. ..................... 257/43 |
| 2010/0006833 A1 * | 1/2010 | Ha et al. .......................... 257/43 |
| 2010/0072468 A1 * | 3/2010 | Yamazaki et al. ............... 257/43 |
| 2011/0024740 A1 * | 2/2011 | Yamazaki et al. ............... 257/43 |

FOREIGN PATENT DOCUMENTS

| GB | 2153589 A | * | 8/1985 |
| JP | 05275696 A | * | 10/1993 |
| JP | 09-186335 A | | 7/1997 |
| JP | 2007073559 A | * | 3/2007 |
| JP | 2009-010431 A | | 1/2009 |
| KR | 10-2004-0079564 A | | 9/2004 |
| KR | 10-2004-0079567 A | | 9/2004 |
| KR | 10 2007-0074650 A | | 7/2007 |
| KR | 10-0882677 B1 | | 2/2009 |

OTHER PUBLICATIONS

English translation of KR100882677 to Jeong et al.(Feb. 2, 2009).*
English Abstract of JP 05275696 to Nakazono (Oct. 1993).*

* cited by examiner

*Primary Examiner* — Sikha Roy
(74) *Attorney, Agent, or Firm* — Lee & Morse, P.C.

(57) ABSTRACT

An organic light emitting diode (OLED) display includes a substrate main body, a thin film transistor formed on the substrate main body, and an OLED formed on the substrate main body. The thin film transistor includes a gate electrode, an oxide semiconductor layer disposed on the gate electrode in an insulated manner, and source and drain electrodes respectively contacting the oxide semiconductor layer. Parts of the source and drain electrodes contacting the oxide semiconductor layer are separated from the gate electrode in a direction that is parallel with the substrate main body by a predetermined distance.

13 Claims, 6 Drawing Sheets

ORGANIC LIGHT EMITTING DIODE DISPLAY INCLUDING SOURCE AND DRAIN ELECTRODES SEPARATED FROM A GATE ELECTRODE

BACKGROUND

1. Field

The described technology relates generally to an organic light emitting diode (OLED) display. More particularly, it relates to an OLED display using an oxide semiconductor layer.

2. Description of the Related Art

An organic light emitting diode (OLED) display is a self emissive display device that displays images with OLEDs. The OLED display differs from a liquid crystal display (LCD) in that it does not require a separate light source, resulting in relatively small thickness and weight. The OLED display also provides high quality characteristics, e.g., low power consumption, high luminance, and short response time.

Recently, attention has been particularly drawn to an OLED display with oxide thin film transistors. The oxide thin film transistor refers to a thin film transistor using an oxide semiconductor layer. The oxide thin film transistor has relatively high mobility and reliability compared to a thin film transistor using amorphous silicon, and exhibits excellent uniformity and overall performance characteristics compared to a thin film transistor using polysilicon. In addition, the OLED display with such oxide thin film transistors is advantageous in constructing a transparent display device. However, an oxide thin film transistor having an inverted staggered structure cannot apply an accurate voltage due to parasitic capacitance so that a defect may occur due to a kick-back voltage.

The above information disclosed in this Background section is only for enhancement of understanding of the background of the described technology and therefore it may contain information that does not form the prior art that is already known in this country to a person of ordinary skill in the art.

SUMMARY

Embodiments are therefore directed to organic light emitting diode (OLED), which substantially overcomes one or more of the problems due to the limitations and disadvantages of the related art.

It is therefore a feature of an embodiment to provide an OLED display having an advantage of minimizing generation of parasitic capacitance while using an oxide thin film transistor.

At least one of the above and other features and advantages may be realized by providing a substrate main body, a thin film transistor on the substrate main body, and an organic light emitting diode (OLED) on the substrate main body. The thin film transistor includes a gate electrode, an oxide semiconductor layer disposed on the gate electrode in an insulated manner, and source and drain electrodes respectively contacting the oxide semiconductor layer. Parts of the source and drain electrodes contacting the oxide semiconductor layer are separated from the gate electrode in a direction that is parallel with the substrate main body by a predetermined distance.

The parts of the source and drain electrodes contacting the oxide semiconductor layer may be separated from the gate electrode by more than 0 μm and no greater than 5 μm in the direction that is parallel with the substrate main body.

The substrate main body may be divided into a display area and a non-display area, and a plurality of pixels may be formed in the display area of the substrate main body to display an image.

Each of the plurality of pixels may include a plurality of thin film transistors.

The organic light emitting diode may be disposed at each of the plurality of pixels and directly connected to one of the plurality of thin film transistors.

The thin film transistor may be formed in both the display area and the non-display area of the substrate main body.

The OLED display may further include an additional thin film transistor wherein at least parts of source and drain electrodes contacting an oxide semiconductor layer overlap a gate electrode.

Each of the pixels may include at least one of the thin film transistors and at least one of the additional transistors.

The organic light emitting diode may be disposed at each pixel and directly connected with the additional thin film transistor.

The thin film transistor may be formed in the display area and the non-display area of the substrate main body, and the additional thin film transistor may be only formed in the display area of the substrate main body.

The thin film transistor may be only formed in the display area of the substrate main body, and the additional thin film transistor may be formed in the display area and the non-display area of the substrate main body.

The thin film transistor and the additional thin film transistor may be respectively formed in both the display area and the non-display area of the substrate main body.

The oxide semiconductor layer may include oxygen (O) and at least one of gallium (Ga), indium (In), zinc (Zn), and tin (Sn).

The gate electrode may be formed of a metal layer.

The gate electrode may be formed of doped polycrystalline silicon.

According to the present invention, the OLED display can minimize generation of parasitic capacitance while using the oxide thin film transistor.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2009-0083666, filed on Sep. 4, 2009, in the Korean Intellectual Property Office, and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Parts that are irrelevant to the description are omitted in order to clearly describe the present invention, and like reference numerals designate like elements throughout the specification.

In the drawings, the thickness of layers, films, panels, regions, etc., are exaggerated for clarity and explanatory convenience. It will be understood that when an element such as a layer, film, region, or substrate is referred to as being "on" another element, it can be directly on the other element or intervening elements may also be present.

Hereinafter, an exemplary embodiment will be described with reference to FIG. 1 to FIG. 3.

Figure 1:
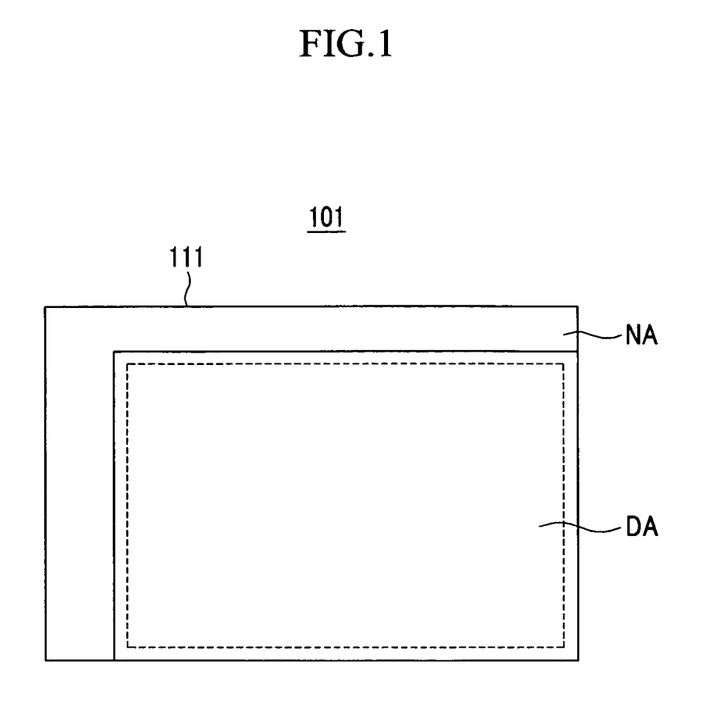
FIG. 1 illustrates a top plan view of a structure of an organic light emitting diode (OLED) display according to an exemplary embodiment.

As shown in FIG. 1, an organic light emitting diode (OLED) display 101 includes a substrate main body 111 divided into a display area DA and a non-display area NA. A plurality of pixels PE (shown in FIG. 2) are formed in the display area DA of the substrate main body 111 for displaying an image, and several driving circuits are formed in the non-display area NA.

Figure 2:
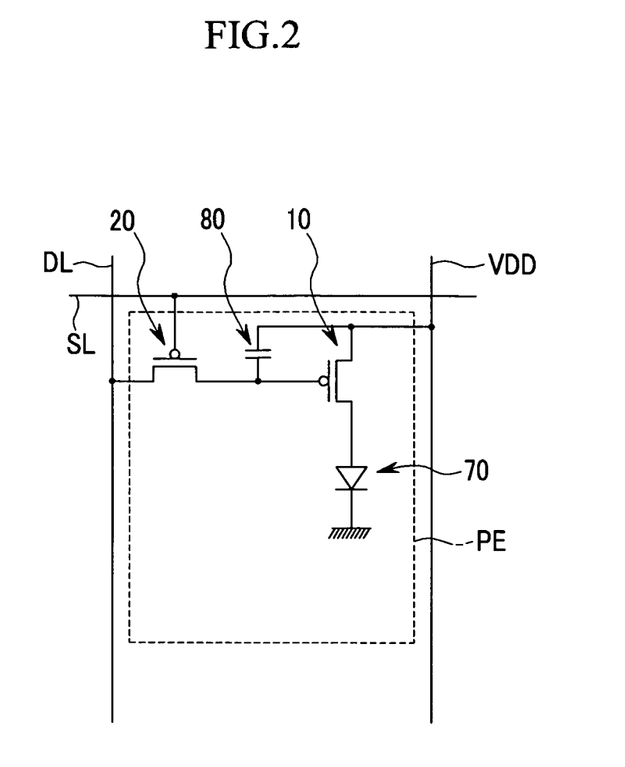
FIG. 2 illustrates a circuit diagram of a pixel circuit of the OLED display of FIG. 1.

As shown in FIG. 2, in the exemplary embodiment, one pixel PE has a 2Tr-1Cap structure formed of one OLED 70, two thin film transistors (TFTs) 10 and 20, and one capacitor 80. However, the exemplary embodiment is not limited thereto. That is, a pixel PE may have three or more TFTs and two or more capacitors, and may have various structures in which a wire is further provided.

The additional TFTs and capacitors may form a compensation circuit. The compensation circuit improves uniformity of an OLED 70 formed at each pixel PE to thereby prevent the image quality from being deviated. In general, the compensation circuit includes four to eight TFTs.

In addition, a driving circuit formed in the non-display area NA of the substrate main body 111 may include an additional TFT.

The OLED 70 includes an anode which is a hole injection electrode, a cathode which is an electron injection electrode, and an organic emission layer disposed therebetween.

The two TFTs according to the exemplary embodiment include a first TFT 10 and a second TFT 20. In addition, when three or more TFTs are formed in one pixel PE, the additional TFT has the same structure as the second TFT 20.

The first TFT 10 and the second TFT 20 respectively include a gate electrode, an oxide semiconductor layer, a source electrode, and a drain electrode. That is, the first TFT 10 and the second TFT 20 are oxide TFTs.

The first TFT 10 is connected to the organic light emitting element 70 and the second TFT 20 is connected to a scan line SL and a data line DL. The second TFT 20 is used as a switch for selecting a pixel PE to emit light. The gate electrode of the second TFT 20 is connected to the scan line SL and the source electrode of the second TFT 20 is connected to the data line DL. The second TFT 20 transmits a data voltage input from the data line DL to the first TFT 10 according to a switching voltage input to the scan line SL.

The capacitor 80 is connected to the second TFT 20 and a common power line VDD, and stores a voltage difference between a voltage transmitted from the second TFT 20 and a voltage supplied to the common power line VDD.

The first TFT 10 supplies driving power for light emission of an OLED 70 of the selected pixel PE. The gate electrode of the first TFT 10 is connected to either capacitor plate of the capacitor 80 connected to the drain electrode of the second TFT 20. In addition, the source electrode of the first TFT 10 and the other capacitor plate of the capacitor 80 are respectively connected to the common power line VDD. The drain electrode of the first TFT 10 is connected to the anode of the OLED 70. As described, the first TFT 10 is connected to the common power line VDD and the capacitor 80 so as to supply an output current IOLED to the OLED 70. The output current IOLED is proportional to the square of the difference between the voltage stored at the capacitor 80 and a threshold voltage. The OLED 70 emits light in accordance with the output current IOLED supplied from the first TFT.

The structure of the pixel PE is not limited to as described above, and may be altered in various manners.

Figure 3:
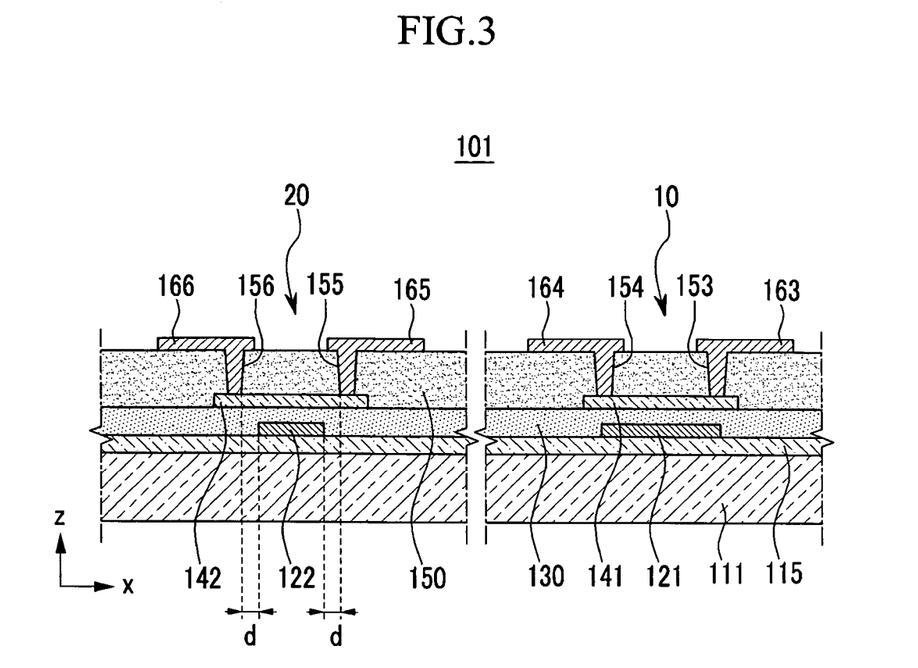
FIG. 3 illustrates a partial cross-sectional view of a thin film transistor of the OLED display of FIG. 1.

As shown in FIG. 3, the first TFT 10 includes a first gate electrode 121, a first oxide semiconductor layer 141, a first source electrode 163, and a first drain electrode 164. The second TFT 20 includes a second gate electrode 122, a second oxide semiconductor layer 142, a second source electrode 165, and a second drain electrode 166. Hereinafter, the structure of the first and second TFTs 10 and 20 according to the exemplary embodiment will be described in detail with reference to FIG. 3, based on the sequence of deposition.

The substrate main body 111 may be an insulative substrate, e.g., glass, quartz, ceramic, or plastic. However, the first exemplary embodiment is not limited thereto, and the substrate main body 111 may be formed with a metallic material such as stainless steel.

A buffer layer 115 is formed on the substrate main body 111. The buffer layer 115 may be formed of at least one of various inorganic and organic layers. The buffer layer 115 prevents the intrusion of undesired components, e.g., impure elements, moisture, or other contaminants, while providing a flatter upper surface to the substrate main body 111. However, the buffer layer 115 is not a necessary constituent element, and may be omitted according to the type and processing conditions of the substrate main body 111.

The first and second gate electrodes 121 and 122 are formed on the buffer layer 115. The first gate electrode 121 and the second gate electrode 122 may be formed of a metal layer. The metal layer used as the first gate electrode 121 and the second gate electrode 122 may include Al, Ag, Cr, Ti, Ta, Mo, or alloys thereof. In this case, the gate electrode 121 may be formed as a single layer, or a multilayer that includes a metal layer of Cr, Mo, Ti, Ta, or alloys thereof, which have excellent physicochemical characteristics, and an Al series or Ag series metal layer having low resistivity. However, the exemplary embodiment is not limited thereto. That is, the first and second gate electrodes 121 and 122 may be formed as doped polycrystalline silicon.

A gate insulating layer 130 formed of silicon nitride (SiNx) or silicon oxide (SiOx) is formed on the first gate electrode 121 and the second gate electrode 122. However, the material of the gate insulating layer 122 according to the exemplary embodiment is not limited thereto.

A first oxide semiconductor layer 141 and a second oxide semiconductor layer 142 are formed on the gate insulating layer 130. At least a part of each of the first oxide semiconductor layer 141 and the second oxide semiconductor layer 142 may overlap the first and second gate electrodes 122.

The first oxide semiconductor layer 141 and the second oxide semiconductor layer 142 may be formed of an oxide including oxygen (O) and at least one of gallium (Ga), indium (In), zinc (Zn), and tin (Sn). For example, the first oxide semiconductor layer 141 and the second oxide semiconductor layer 142 may be formed with a mixture oxide, e.g., InZnO, InGaO, InSnO, ZnSnO, GaSnO, GaZnO, and GaInZnO.

The TFTs 10 and 20 using the oxide semiconductors 141 and 142 have effective mobility of charges that is two times to one hundred times greater than the TFT using hydrogenated amorphous silicon, and an on/off current ratio of 105 to 108. That is, the TFTs 10 and 20 having the oxide semiconductor layers 141 and 142 have a comparatively excellent semiconductor characteristic. In addition, in the case of the oxide semiconductor layers 141 and 142, no leakage optical current with respect to visible light is generated because the band gap is about 3.0 to 3.5 eV. Therefore, momentary afterimages of the TFTs 10 and 20 may be reduced or prevented. In addition, in order to improve the characteristics of the TFTs 10 and 20, the oxide semiconductor layers 141 and 142 may further contain elements of the third, fourth, or fifth groups of the periodic table, or transition elements.

An interlayer insulating layer 150 is formed on the first oxide semiconductor layer 141 and the second oxide semiconductor layer 142. The interlayer insulating layer 150 includes a first source contact hole 153 and a first drain contact hole 154 that partially expose the first oxide semiconductor layer 141, and a second source contact hole 155 and a second drain contact hole 156 that partially expose the second oxide semiconductor layer 142. Like the gate insulating layer 130, the interlayer insulating layer 150 may be formed of silicon nitride (SiNx) or silicon oxide (SiOx).

A first source electrode 163, a first drain electrode 154, a second source electrode 165, and a second drain electrode 166 are formed on the interlayer insulating layer 150. The first source electrode 163 and the first drain electrode 164 contact the first oxide semiconductor layer 141 through the first source contact hole 153 and the first drain contact hole 154 of the interlayer insulating layer 150. In addition, the second source electrode 165 and the second drain electrode 166 contact the second oxide semiconductor layer 142 through the second source contact hole 155 and the second drain contact hole 156 of the interlayer insulating layer 150.

However, the exemplary embodiment is not limited thereto, and the interlayer insulating layer 150 may be omitted as necessary. When the interlayer insulating layer 150 is omitted, parts of the first source electrode 163 and the first drain electrode 164 may be formed to directly contact the first oxide semiconductor layer 141, and parts of the second source electrode 165 and the second drain electrode 166 may be formed to directly contact the second oxide semiconductor layer 142.

In addition, at least parts of the first source electrode 163 and the first drain electrode 164 that contact the first oxide semiconductor layer 141 overlap the first gate electrode 121, i.e., along the x-direction. In contrast, the second source electrode 165 and the second drain electrode 166 that contact the second oxide semiconductor layer 142 are separated from the second gate electrode 122 in a direction that is parallel with the substrate main body 111 by a predetermined distance (d). That is, the second source electrode 165 and the second drain electrode 166 that contact the second oxide semiconductor layer 142 do not overlap the second gate electrode 122.

The predetermined distance is greater than 0 μm and less than 5 μm. As the second source electrode 165 and the second drain electrode 166 that contact the second oxide semiconductor layer 142 are separated, parasitic capacitance generated between the second gate electrode 122, the second source electrode 165, and the second drain electrode 166 is decreased. However, as the second source electrode 165 and the second drain electrode 166 are separated from the second gate electrode 122, effective mobility of charges is decreased.

That is, if the second source electrode 165 and the second drain electrode 166 are separated by more than 5 μm from the second gate electrode 122, the mobility of the charges may decrease enough to deteriorate performance of the second TFT 20. When the second source electrode 165 and the second drain electrode 166 overlap the second gate electrode 122, the parasitic capacitance is unnecessarily generated.

Figure 6A:
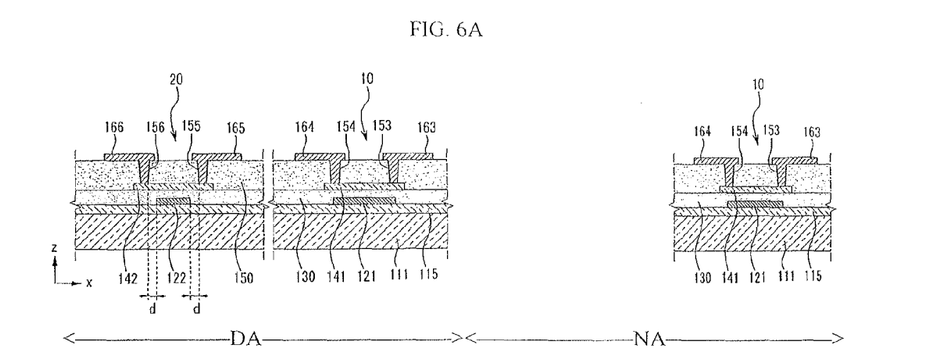
FIGS. 6A, 6B, and 6C schematically illustrate partial cross-sectional views of a thin film transistor of the OLED display of FIG. 1 according to exemplary embodiments.
Figure 6B:
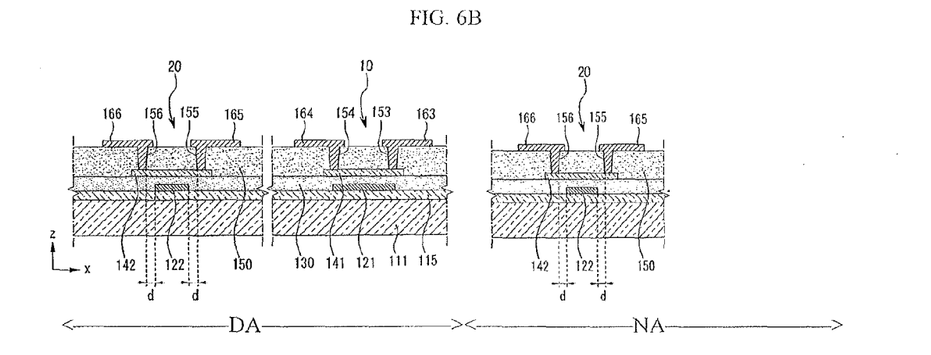

With the above configuration, the first TFT 10 is used for driving the OLED 70 and the second TFT 20 is used as a switch or a compensation circuit. In addition, the second TFT 20 may be used in a driving circuit formed in the non-display area NA (shown in FIG. 1) of the substrate main body 111, as illustrated in FIG. 6B.

Figure 6C:
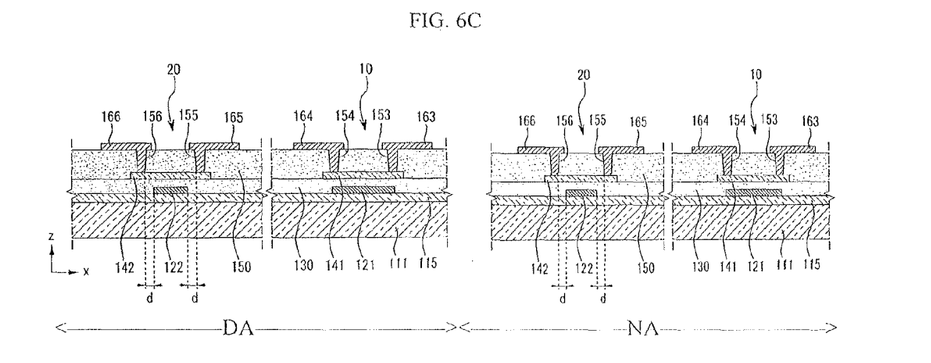

However, the OLED display 101 according to the exemplary embodiment is not limited thereto. That is, the first TFT 10 may be used in the driving circuit formed in the non-display area NA (shown in FIG. 1) of the substrate main body 111, as illustrated in FIG. 6A. In addition, the first and second TFTs 10 and 20 may both be formed in the driving circuit formed in the non-display area NA (shown in FIG. 1) of the substrate main body 111, as illustrated in FIG. 6C.

Since the first TFT 10 is connected to the OLED 70 and drives the same, high mobility of charges becomes a critical characteristic in driving of the OLED 70. Therefore, the first source electrode 163 and the first drain electrode 164 of the first TFT 10, contacting the first oxide semiconductor layer 141, partially overlap the first gate electrode 121 to obtain high mobility of charges, even though parasitic capacitance is generated.

Meanwhile, the second TFT 20 reduces generation of the parasitic capacitance by separating the second source electrode 165 and the second drain electrode 166 that contact the second oxide semiconductor layer 142 from the second gate electrode 122. In addition, the second TFT 20 can guarantee mobility of greater than 1 cm$^2$/Vs because the distance d between the second source electrode 165 and the second drain electrode 166 and the second oxide semiconductor layer 142 is within 5 μm. That is, the second TFT 20 minimizes generation of the parasitic capacitance while guaranteeing required mobility of charges.

With the above-described configuration, the OLED display 101 can minimize generation of parasitic capacitance while using an oxide TFT in an inverted staggered structure. However, the OLED display 101 according to the exemplary embodiment is not limited thereto. For example, all the TFTs used in the OLED display 101 may have the same structure as the second TFT 20. In further detail, in the OLED display 101, one pixel PE may include a plurality of second TFTs rather than including the first TFT 10 and the second TFT 20. That is, the second TFT 20 may also function as the first TFT 10 by being formed in both the display area DA and the non-display area NA of the substrate main body 111. In this case, the OLED 70 may be connected with one of the plurality of second TFTs 20. That is, the second TFT 20 may be used for driving the OLED 70, and may be used in a switch or a compensation circuit. According to the above configuration, the OLED display 101 may extremely minimize generation of parasitic capacitance while using an oxide TFT in an inverted staggered structure.

Hereinafter, experimental examples according to an exemplary embodiment will be described with reference to FIG. 4 and FIG. 5. Like the second TFT 20 according to the exemplary embodiment, in the experiments, a TFT having a structure in which a source electrode and a drain electrode contacting an oxide semiconductor layer do not overlap a gate electrode was used. In addition, the width and length of TFTs used in the present experiments were respectively set to 10 p.m.

A distance d between the source and drain electrodes contacting the oxide semiconductor layer and the gate electrode was set to 0 μm in Experimental Example 1, 1 μm in Experimental Example 2, 2 μm Experimental Example 3, 3 μm in Experimental Example 4, and 4 μm in Experimental Example 5, respectively.

Figure 4:
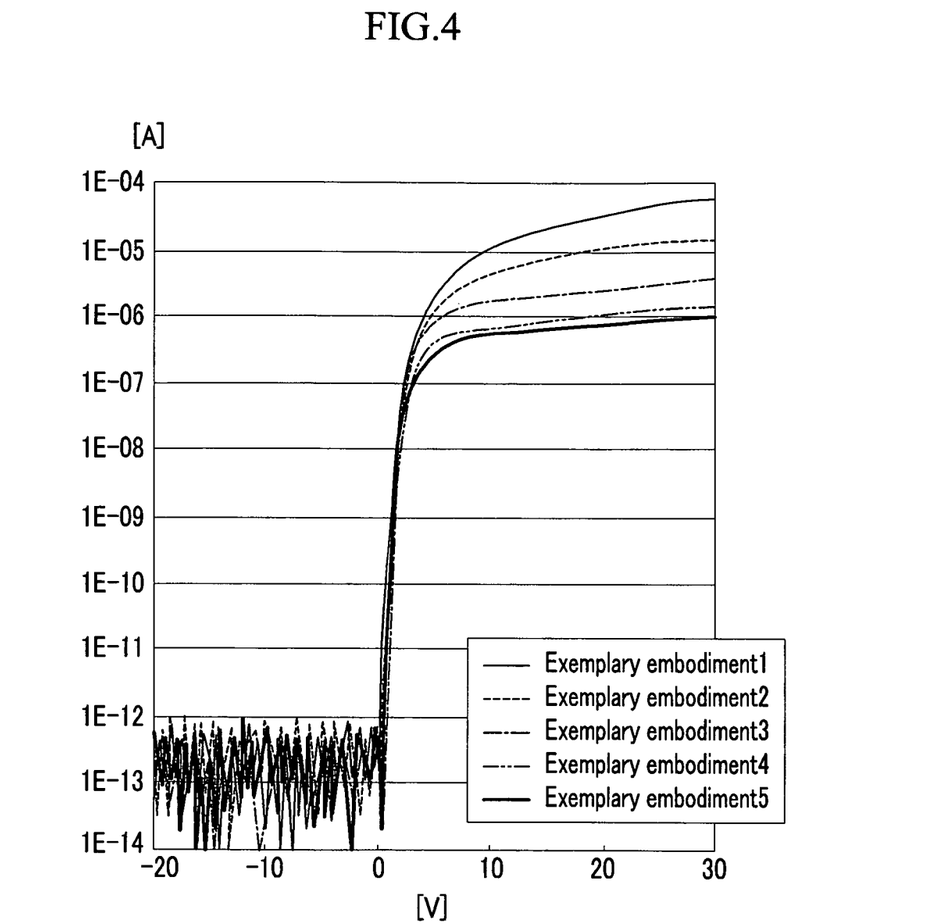
FIG. 4 and FIG. 5 illustrate graphs comparing performances of experimental examples according to the exemplary embodiment.
Figure 5:
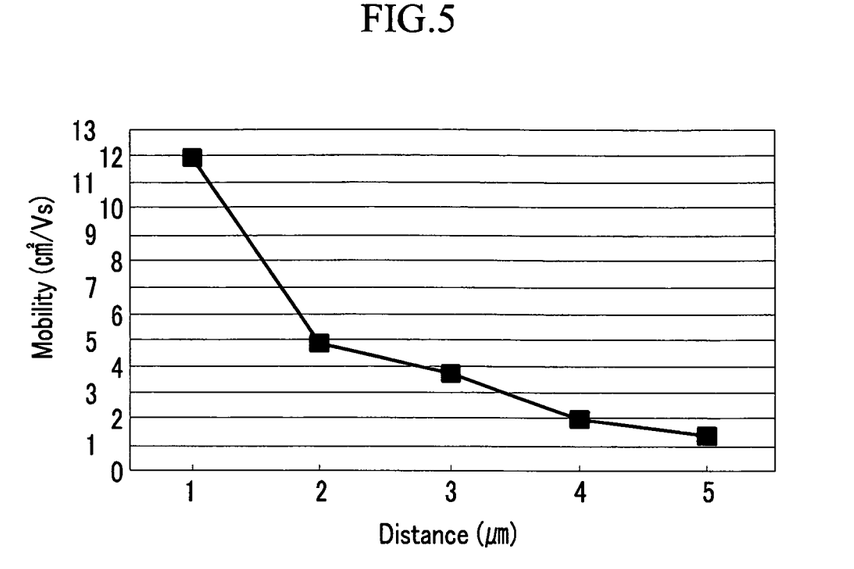

As shown in FIG. 4, when the distance between the source and drain electrodes and the gate electrode was 4 μm, the on/off current ratio was within $10^5$ 1E-5 to $10^8$ 1E-8, indicating satisfactory characteristics. In addition, as shown in FIG. 5, although the distance between the source and drain electrodes and the gate electrode was relatively large, 5 μm, mobility of charges of greater than 1 $cm^2/Vs$ was still realized.

The experiments show that an oxide TFT having a source electrode and a drain electrode in which portions of the source and drain electrodes in contact with the oxide semiconductor layer are separated from a gate electrode along a direction parallel to a substrate main body on which the TFT is formed provide sufficient electron mobility to allow the oxide TFT to be used in a switch or a compensation circuit while suppressing generation of parasitic capacitance.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display, comprising:
    a substrate main body, wherein the substrate main body is divided into a display area and a non-display area, and a plurality of pixels is formed in the display area of the substrate main body to display an image;
    a first thin film transistor and a second thin film transistor on the substrate main body; and
    an OLED on the substrate main body, wherein:
    the first thin film transistor includes a gate electrode, an oxide semiconductor layer disposed on the gate electrode in an insulated manner, and source and drain electrodes respectively contacting the oxide semiconductor layer,
    parts of the source and drain electrodes of the first thin film transistor contacting the oxide semiconductor layer of the first thin film transistor are separated from the gate electrode of the first thin film transistor in a direction that is parallel with the substrate main body by no greater than 5 μm, and
    at least parts of source and drain electrodes of the second thin film transistor contact an oxide semiconductor layer of the second thin film transistor and overlap a gate electrode of the second thin film transistor along the direction that is parallel with the substrate main body.

2. The OLED display as claimed in claim 1, wherein: each of the plurality of pixels includes at least one first thin film transistor.

3. The OLED display as claimed in claim 2, wherein the OLED is disposed at each of the plurality of pixels and directly connected to a respective first thin film transistor.

4. The OLED display as claimed in claim 3, wherein the first thin film transistor is formed in both the display area and the non-display area of the substrate main body.

5. The OLED display as claimed in claim 1, wherein: each of the pixels includes at least one first thin film transistor and at least one second thin film transistor.

6. The OLED display as claimed in claim 5, wherein the OLED is disposed at each pixel and directly connected with a respective second thin film transistor included in the pixel.

7. The OLED display as claimed in claim 6, wherein the first thin film transistor is formed in the display area and the non-display area of the substrate main body, and the second thin film transistor is only formed in the display area of the substrate main body.

8. The OLED display as claimed in claim 6, wherein the first thin film transistor is only formed in the display area of the substrate main body, and the second thin film transistor is formed in the display area and the non-display area of the substrate main body.

9. The OLED display as claimed in claim 6, wherein the first thin film transistor and the second thin film transistor are respectively formed in both the display area and the non-display area of the substrate main body.

10. The OLED display as claimed in claim 6, wherein the respective second thin film transistor directly connected to the OLED disposed at each pixel is the only thin film transistor of the OLED display that has at least parts of source and drain electrodes contacting an oxide semiconductor layer overlap a gate electrode along the direction that is parallel with the substrate main body.

11. The OLED display as claimed in claim 1, wherein the oxide semiconductor layer includes oxygen (O) and at least one of gallium (Ga), indium (In), zinc (Zn), and tin (Sn).

12. The OLED display as claimed in claim 11, wherein the gate electrode is metal.

13. The OLED display as claimed in claim 11, wherein the gate electrode is doped polycrystalline silicon.

* * * * *